(12) United States Patent
Zhu et al.

(10) Patent No.: US 11,011,323 B2
(45) Date of Patent: May 18, 2021

(54) SENSING DEVICES, SENSORS, AND METHODS FOR MONITORING ENVIRONMENTAL CONDITIONS

(71) Applicant: BELLUTECH LLC, Ann Arbor, MI (US)

(72) Inventors: Weibin Zhu, Saline, MI (US); Navid Yazdi, Ann Arbor, MI (US)

(73) Assignee: BelluTech LLC, Ann Arbor, MI (US)

( * ) Notice: Subject to any disclaimer, the term of this patent is extended or adjusted under 35 U.S.C. 154(b) by 168 days.

(21) Appl. No.: 16/206,386

(22) Filed: Nov. 30, 2018

(65) Prior Publication Data

US 2019/0172657 A1    Jun. 6, 2019

Related U.S. Application Data

(60) Provisional application No. 62/593,929, filed on Dec. 2, 2017, provisional application No. 62/596,876, filed on Dec. 10, 2017.

(51) Int. Cl.
| | |
|---|---|
| *H01H 1/00* | (2006.01) |
| *B81B 3/00* | (2006.01) |
| *G01K 5/48* | (2006.01) |
| *G01K 5/56* | (2006.01) |
| *G01K 5/72* | (2006.01) |
| *G01K 3/04* | (2006.01) |

(52) U.S. Cl.
CPC ......... *H01H 1/0036* (2013.01); *B81B 3/0059* (2013.01); *G01K 3/04* (2013.01);
(Continued)

(58) Field of Classification Search
CPC ............ H01H 1/0036; H01H 2239/06; H01H 2001/0078; G01K 5/72; G01K 3/04;
(Continued)

(56) References Cited

U.S. PATENT DOCUMENTS

| | | | |
|---|---|---|---|
| 6,184,699 B1 * | 2/2001 | Smith | G01R 1/06711 |
| | | | 324/755.05 |
| 6,739,132 B2 | 5/2004 | Bromley et al. | |

(Continued)

FOREIGN PATENT DOCUMENTS

JP    20080238330    10/2008

OTHER PUBLICATIONS

International Search Report and Written Opinion for International Application PCT/US2018/063234, dated Mar. 21, 2019, 15 pages.

(Continued)

*Primary Examiner* — Xin Y Zhong

(74) *Attorney, Agent, or Firm* — Hartman Global IP Law; Gary M. Hartman; Domenica N. S. Hartman

(57) ABSTRACT

Sensors, systems, and methods for monitoring environmental conditions, such as physical, electromagnetic, thermal, and/or chemical parameters within an environment, over extended periods of time with the use of one or more electromechanical sensing devices and electronic circuitry for processing an output of the sensing devices. The sensing devices each include a cantilevered structure and at least one contact configured for contact-mode operation with the cantilevered structure in response to the cantilevered structure deflecting toward or away from the contact when exposed to the parameter of interest. The cantilevered structure has at least first and second beams of dissimilar materials, at least one of which has at least one property that changes as a result of exposure to the parameter.

27 Claims, 7 Drawing Sheets

(52) U.S. Cl.
CPC ............... *G01K 5/486* (2013.01); *G01K 5/56* (2013.01); *G01K 5/72* (2013.01); *B81B 2201/0278* (2013.01); *B81B 2201/0292* (2013.01); *B81B 2201/032* (2013.01); *B81B 2203/0118* (2013.01); *H01H 2001/0078* (2013.01); *H01H 2239/06* (2013.01)

(58) Field of Classification Search
CPC ........ G01K 5/486; G01K 5/56; B81B 3/0059; B81B 2203/0118; B81B 2201/0278; B81B 2201/0292; B81B 2201/032
See application file for complete search history.

(56) References Cited

U.S. PATENT DOCUMENTS

| | | |
|---|---|---|
| 7,495,368 B2 | 2/2009 | Gogoi et al. |
| 7,619,346 B2 | 11/2009 | Yazdi |
| 7,827,660 B2 | 11/2010 | Gogoi et al. |
| 7,907,037 B2 | 3/2011 | Yazdi |
| 8,440,973 B1 | 5/2013 | Fernandez et al. |
| 8,487,508 B2 | 7/2013 | Yazdi |
| 8,677,802 B2 | 3/2014 | Hower et al. |
| 2003/0132823 A1 | 7/2003 | Hyman et al. |
| 2003/0200749 A1* | 10/2003 | Bromley .................. F03G 7/06 60/527 |
| 2008/0054756 A1* | 3/2008 | Gogoi .................. H01H 1/0036 310/307 |
| 2011/0009773 A1 | 1/2011 | Hower et al. |
| 2011/0132449 A1 | 6/2011 | Ramadas et al. |
| 2017/0102249 A1* | 4/2017 | Yazdi .................. H01H 1/0036 |

OTHER PUBLICATIONS

International Search Report and Written Opinion dated Jan. 10, 2017, for PCT/US16/55887 filed Oct. 7, 2016.

* cited by examiner

SENSING DEVICES, SENSORS, AND METHODS FOR MONITORING ENVIRONMENTAL CONDITIONS

CROSS REFERENCE TO RELATED APPLICATIONS

This application claims the benefit of U.S. Patent Application Ser. Nos. 62/593,929 and 62/596,876, filed Dec. 2, 2017, and Dec. 10, 2017, respectively. The contents of these prior patent documents are incorporated herein by reference.

BACKGROUND OF THE INVENTION

The present invention generally relates to electromechanical devices. More particularly, this invention relates to electromechanical devices and electromechanical device-based sensors, systems, and methods capable of monitoring environmental conditions, such as physical, electromagnetic, thermal, and/or chemical parameters within an environment.

Wireless sensors are capable of high reliability, efficiency, and performance and enable ambient intelligence, total visibility, and smart adaptive systems. As such, wireless sensors have found uses in a wide range of applications including supply chain and logistics, industrial and structural monitoring, healthcare, homeland security, and defense. Wireless sensors also find use as nodes of wireless networks, including the Internet of Things (IoT) that connects objects together and to people. Wireless sensors typically include a battery or other energy source.

Generally, it is desired to minimize the power dissipation, size, and cost of wireless sensors by minimizing their power requirements. Wireless sensors can be equipped with integrated miniature batteries or capacitors as a dedicated on-board power source, as well as configured for operation without a power storage device. In many applications, battery less operation may be preferred or required due to lack of battery replacement feasibility or stringent cost, form factor, and lifetime requirements. One approach to address this need is scavenging energy from environmental sources such as ambient heat, radio and magnetic waves, vibrations, and light, provided that at least one of these parameters is adequately available. Another approach is to remotely power a sensor by inductive or electromagnetic coupling, in which case energy may be optionally stored on an integrated capacitor so that sensor operation may occur over a short period of time prior to the capacitor becoming completely discharged. Finally, there are sensors that do not need any external energy source for sensing because they operate based on chemical reactions or mechanical events resulting in a color change or another change in their properties that can be detected by visual inspection or with use of an electronic detection system. The latter types of wireless sensors are generally in the form of sensor labels and do not readily lend themselves to automation.

U.S. Pat. Nos. 7,495,368, 7,619,346, 7,827,660, 7,907,037, 8,487,508, and 8,677,802 and U.S. Patent Application Publication No. 2017/0102249 disclose digital micro-electro-mechanical-system (MEMS) sensing devices that can be manufactured and packaged at wafer-level with integrated circuits to yield a sensing module. The sensing devices can be fabricated to form arrays configured to respond to different levels of an environmental condition or parameter to cumulatively measure the environmental condition.

BRIEF DESCRIPTION OF THE INVENTION

The present invention provides sensors, systems, and methods capable of monitoring environmental conditions, such as physical, electromagnetic, thermal, and/or chemical parameters within an environment, over extended periods of time using one or more electromechanical cantilevered structures that deflect to open or close a contact in response to the parameter.

According to one aspect of the invention, an electromechanical sensing device is provided that comprises a cantilevered structure and at least one contact configured for contact-mode operation with the cantilevered structure. The cantilevered structure is responsive to a parameter within an environment and to deflect toward or away from the contacts thereof in response to the parameter in the environment. The cantilevered structure comprises first and second beams containing dissimilar first and second materials, respectively. The first and second beams are side-by-side, spaced apart so as to define a gap there between along the lengths of the first and second beams, and lie in a plane that contains the cantilevered structure. The first material has at least one property that changes due to exposure to the parameter and a change in the property causes the cantilevered structure to deflect in a direction lying in the plane of the first and second beams as a result of the dissimilarity of the first and second materials. The cantilevered structure is configured to contact and close or break contact and open the contacts at a predetermined level of the parameter or from cumulative exposure to the parameter over time.

According to another aspect of the invention, a sensor is provided that includes at least one electromechanical sensing device of a type described above. The sensor further includes means for producing a digital output when the cantilevered structure contacts and closes at least one of the contacts thereof.

According to yet another aspect of the invention, a method is provided for sensing and optionally also monitoring a parameter within an environment. The method entails the use of at least one electromechanical sensing device of a type described above, and includes exposing the cantilevered structure to the parameter within the environment to cause the cantilevered structure to deflect in the direction lying in the plane of the first and second beams to contact and close one of the contacts or break contact and open one of the contacts. A digital output is produced when the cantilevered structure contacts and closes or breaks contact and opens the contacts thereof.

Sensing devices of the type described above may be self-powered electromechanical sensing elements that deflect and close or open an electrical contact based on various parameters that may exist within an environment. As such, the sensing devices do not require a dedicated power source to sense and monitor a parameter within an environment, but instead utilize the parameter to generate a digital output. Technical effects of sensors that utilize such sensing devices preferably include the ability to continuously monitor environmental conditions over extended periods of time. Such a sensor can be used in a network adapted to continuously monitor various environmental conditions, for example, exposure to heat, humidity, chemicals, or electromagnetic radiation, in a wide variety of applications including supply-chain management of perishable goods such as pharmaceuticals, chemicals, and fresh agriculture products, as well as environmental and industrial applications that benefit from detecting the presence of heat, chemicals, electromagnetic radiation, and chemicals.

Other aspects and advantages of this invention will be appreciated from the following detailed description.

DETAILED DESCRIPTION OF THE INVENTION

Figure 1:
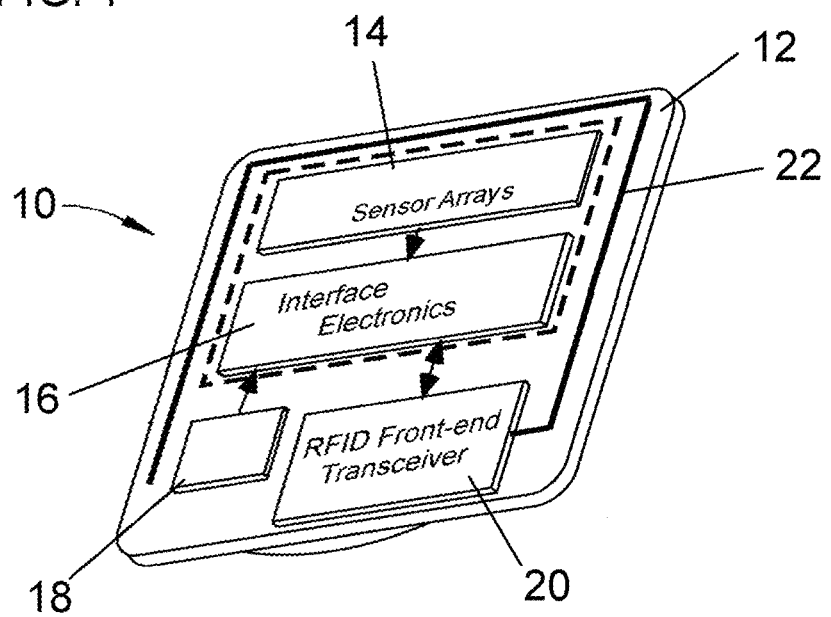
FIG. 1 schematically represents a perspective view of a sensor configured to monitor environmental conditions, such as physical, electromagnetic, thermal, and/or chemical parameters within an environment.

The following describes electromechanical devices, electromechanical device-based sensors and systems, and methods adapted to monitor environmental conditions, such as physical, electromagnetic, thermal, and/or chemical parameters within an environment. As used herein, the term "electromechanical device(s)" will be used to mean various types of miniaturized electromechanical systems, including micro-electromechanical systems (MEMS) and nano-electromechanical systems (NEMS), that are generally on a scale of less than a millimeter, incorporate both electronic and mechanical functionalities, and are produced by micromachining techniques such as bulk etching and/or surface thin-film etching.

The electromechanical devices are configured as sensing devices that include at least one electrical contact and a sensing element capable of moving to open or close the electrical contact(s) in response to the presence or absence of an environmental parameter of interest. The sensing element comprises a cantilevered structure, preferably on a scale of less than a millimeter and formed by a micromachining technique. In preferred embodiments, the cantilevered structure comprises at least two beams that are arranged side-by-side but spaced apart from each other, resulting in a gap between the beams along their lengths. Additionally, the beams are formed to contain dissimilar materials. Because the cantilevered structures are represented as comprising beams in the embodiments shown in the drawings, the term "beam" will be used in the following discussion though the invention will be understood to encompass other cantilevered structures, including diaphragms. According to a preferred aspect, at least one of the dissimilar materials of the cantilevered structure is formed of a material that has at least one property that changes when exposed to the parameter of interest, and in so doing causes the cantilevered structure to deflect in a direction within a plane in which the cantilevered structure lies. The term bimorphic effect is commonly used to refer to such a bending effect in a single beam formed by two active layers, and this term will be used herein to more generally refer to a bending effect that a combination of dissimilar materials will cause in a cantilevered structure in response to exposure to a parameter of interest. In particular, the dissimilar materials are selected to have mismatched expansion/contraction (elongation/shrinkage) responses to a parameter of interest, resulting in the cantilevered structure bending toward the beam that shrinks more or does not elongate as much as the other beam. If the parameter is at a sufficiently high (threshold) level, the deflection of the cantilevered structure is sufficient to open or close (depending on the operating mode of the sensing device) an electrical contact associated therewith, which can serve to interrupt or allow, respectively, the transfer of a charge or electrical current, generation of an electrical voltage, or provide another form of output capable of corresponding to a digital signal. Contact between the cantilevered structure and an electrical contact is referred to herein as a contact-mode switching function or contact mode operation, and is preferably non-latching, in other words, other than as a result of its bending or deflection, the cantilevered structure is not mechanically latched or otherwise secured to the contact.

In certain embodiments, the property change in the beam responsive to the parameter (hereinafter, the "sensing beam") is temporary and reversible, for example, if the result of moisture (moisture-induced expansion or contraction) or temperature (thermal expansion or contraction), and the resulting response (deflection) of the cantilevered structure is temporary. In certain other embodiments, the property change in the sensing beam alters the intrinsic stress of the sensing beam due to a curing or absorption process that occurs within the material of the sensing beam. For example, the sensing beam can be formed of an organic material, in which shrinkage or expansion or an increase in hardness of the material occurs that is caused by absorption of an environmental agent or by cross linking of polymer chains within the material resulting from a chemical reaction that increases the average length and/or degree of cross linking between constituent oligomers of the material. Such property changes in an organic material of the sensing beam can be induced by a number of different parameters that may exist or occur within an environment, nonlimiting examples of which include temperature, moisture (humidity), electromagnetic radiation (as nonlimiting examples, visible light, ultraviolet (UV) radiation, etc.), nuclear material radiation (gamma, beta, neutron), and chemicals (as nonlimiting examples, gases, biological agents, etc.). In most instances in which the property change in the sensing beam is the result of curing of an organic material in the sensing beam, the curing of the organic material will be irreversible and the response (deflection) of the cantilevered structure will tend to be permanent. Because curing and absorption are commonly time-dependent processes, the property change in the material and the resultant response of the cantilevered structure will also depend on the level of the parameter within the environment and the total exposure to the parameter over time, referred to herein as a cumulative time-parameter level combination, for example, a cumulative time temperature combination if heat is the parameter of interest. It is foreseeable that the response (deflection) of the cantilevered structure could be temporary or reversible. For example, another beam of the cantilevered structure could be formed of a material in which a property change can be induced to cause the cantilevered structure to deflect in a direction lying in the plane of the beams, but opposite the direction caused by the property change induced in the sensing beam by the property of interest. Alternatively, the curing of the material of the sensing beam could be reversible through a thermal or chemical treatment, causing the cantilevered structure to at least partially return to its original orientation relative to the contacts. Similarly, in some instances absorption of an environmental agent, for example, a chemical, particles, moisture, etc., may be reversed by an appropriate desorption process, causing the cantilevered structure to at least partially return to its original orientation relative to its contacts.

FIG. 1 schematically represents an example of an electromechanical device-based sensor 10 in the form of a radio frequency identification (RFID) tag that may contain one or more arrays of electromechanical sensing devices comprising sensing elements of the types discussed above. FIG. 1 represents components of the sensor 10 as including a substrate 12 that carries a sensor package 14 containing the sensing devices. The sensor 10 is also represented as including electronic circuitry, represented in FIG. 1 as including, but not limited to interface electronics 16, an RFID front-end transceiver 20, and an antenna 22. The interface electronics 16 may be adapted to digitally process the outputs generated by the sensing elements of the package 14 to produce a sensor output that can be wirelessly transmitted by the transceiver 20. Alternatively, digital processing of the outputs of the sensing devices may not be necessary, in which case the interface electronics 16 may be adapted to simply receive the outputs of the sensing devices and relay these outputs to the transceiver 20 as the sensor output. Over any period of time during the operation of the sensor 10, the sensor output may be reported as a cumulative output indicating the responses of the sensing devices to the parameter of interest over time.

The substrate 12 of the sensor 10 can be of any suitable construction and material, such as those currently used in RFID and/or electronics technologies, and therefore will not be discussed in any detail here. Other than as noted below, the transceiver 20 and antenna 22 can also be of known construction and design, and therefore will only be discussed to the extent necessary for those skilled in the art to understand and implement various embodiments of the invention. Wireless communication between the sensor 10 and a suitable wireless interrogator (reader unit) may be through a passive RFID communications protocol, though other wireless protocols are also foreseeable. RFID standards (nonlimiting examples of which include NFC, ISO-18000-3, ISO 18000-6, UHF Gen2, ISO-15693) support simultaneous data collection by a single RFID interrogator from multiple sensors having unique electronic ID codes, enabling more than one sensor 10 to be used in a monitoring system or network without requiring a battery. From the following discussion, it will become apparent that not all components depicted in FIG. 1 are required by the invention, and additional components could be added. As a nonlimiting example, FIG. 1 shows an optional battery 18 included in the sensor 10 to extend the wireless communication range as commonly known in the industry.

The sensor package 14 of FIG. 1 may contain one or more arrays of electromechanical sensing devices. The sensor package 14 and its sensing devices are preferably configured to provide certain advantages particular to the present invention. The sensing devices are preferably fabricated on a substrate and enclosed with a capping wafer that provides access to the environment as may be required by the sensing devices. Though not shown, the interface electronics 16 may also be enclosed within the package 14.

A nonlimiting example of an electromechanical sensing device 26 capable of use with the sensor 10 of FIG. 1 is represented in FIGS. 2A, 2B, 3A, 3B, 4A, and 4B. The sensing device 26 is representative of one of any number of sensing devices 26 within the package 14. The device 26 is represented as having a cantilevered structure 30, which serves as a moving sensing element of the sensing device 26. The cantilevered structure 30 is represented as comprising first and second beams 44 and 46 that are formed so that one of the beams 44/46 contains at least one material that is dissimilar from at least one material within the other beam 44/46. The beams 44 and 46 of the nonlimiting embodiment of FIGS. 2A-4B are represented as being side-by-side, parallel, spaced apart so as to define a gap 50 there between along their lengths, and lying in a single plane that contains the entire cantilevered structure 30. One end of the cantilevered structure 30 is affixed to or integrally formed with an anchor 34, as a nonlimiting example, fabricated as a feature on a conventional CMOS circuit substrate in which the interface electronics 16 may also be fabricated. The opposite cantilevered (distal) end of the cantilevered structure 30 is shown as being suspended in proximity to a set of contacts 40 and 42. The adjacent distal ends of the beams 44 and 46 are shown as being bridged or otherwise joined by a connector 48, which in the embodiment of FIGS. 2A-4B is represented as an extension of the beam 46 that extends transverse to the parallel direction of the beams 44 and 46. Alternatively, the connector 48 may be a separate structure and/or formed of a material that is different from the materials used to fabricate the beams 44 and 46.

The device 26 and its cantilevered structure 30 may be fabricated directly on an integrated circuit substrate (e.g., CMOS wafer) in which electronic devices of the sensor 10 can also be formed. An alternative is to fabricate the device 26 and its cantilevered structure 30 on a separate substrate that is subsequently electrically coupled or bonded to a substrate. It can be readily appreciated that the cantilevered structure 30 of the sensing device 26 is simple and compatible with post-CMOS processing, and that very large, high-density arrays of the sensing device 26 can be fabricated in a very small area. It is foreseeable that structures other than cantilevered beams could be employed that are capable of responding to an environmental parameter of interest by closing and/or opening electrical contacts.

The dissimilar materials of the beams 44 and 46 are chosen to cause the cantilevered structure 30 to bend or deflect in response to an environmental parameter of interest. As noted above, the individual responses of the cantilevered structure 30 to an environmental parameter of interest may be referred to as bimorphic in the following discussion, though it should be understood that a strictly bimorphic cantilevered structure is not required, in other words, the cantilevered structure 30 do not require two active beams, and instead may have a single active beam or more than two active beams. The device 26 can be configured to sense a wide variety of different environmental parameters to which the sensor 10 might be subjected, nonlimiting examples of which include temperature, moisture/humidity, electromagnetic radiation, nuclear particle radiation, chemicals, biological agents, etc., as previously noted. Such capabilities can be achieved by using appropriate materials to form the cantilevered structure 30 of the sensing device 26, as will be understood from the following discussion.

As previously noted, the dissimilar materials of the beams 44 and 46 are selected to have mismatched expansion/contraction (elongation/shrinkage) responses to a parameter of interest, resulting in the cantilevered structure 30 bending toward the beam 44 or 46 that shrinks more or does not elongate as much as the other beam 46 or 44. In the nonlimiting embodiment of FIGS. 2A-4B, in which the cantilevered (distal) end of the cantilevered structure 30 is suspended between a set of contacts 40 and 42, the cantilevered structure 30 may deflect in either of two directions to contact and close (or break contact and open) either contact 40 and 42. Due to the side-by-side arrangement of the beams 44 and 46, the deflection of the cantilevered structure 30 is in a direction within a plane in which the cantilevered structure 30 and its beams 44 and 46 lie, as evident from comparing FIGS. 2A and 2B with FIGS. 3A and 3B and FIGS. 4A and 4B. The gap 50 defined by and between the beams 44 and 46 is depicted as being uniform in its width along the lengths of the beams 44 and 46 as a result of the beams 44 and 46 being side-by-side and parallel. The presence of the gap 50 results in the beams 44 and 46 not being in direct contact with each other along their entire lengths, with only the distal ends being interconnected through the connector 48. As such, the active length portions of the beams 44 and 46 that produce the bimorphic effect do not directly contact or interact with each other.

According to a preferred aspect of the invention, the sensing device 26 is an electromechanical structure that functions as a switch in response to one or more environmental parameters of the environment surrounding the sensor 10. As such, the sensing device 26 is able to extract the energy needed for mechanical switching from the environment itself, thereby drastically reducing the power required to sense an environmental parameter. The mechanical switching operations of an array of the sensing device 26 are inherently digital and can be converted to an electrical signal using, for example, simple compact front-end circuitry. Such circuitry may make use of a minimal number of transistors and dissipate less than a few or tens of picowatts per sensing device 26, resulting in a total electrical power dissipation from the sensor 10 on the order of ones or tens of nanowatts when the sensor 10 is placed in the electrical field of a wireless interrogator (for battery less operation) or powered (if needed or desired) by an on-sensor battery or other energy source (if included). As such, a sensor 10 utilizing one or more of the sensing device 26 is capable of operating in a manner that avoids the limitations of many existing IC-based sensors that are designed to operate in a battery less configuration in which the sensor 10 is powered and its sensor output is transmitted through a wireless link when in the electrical field of a wireless interrogator (e.g., an RFID interrogator). Even if designed for lower power consumption, existing IC-based sensors are incompatible for continuous monitoring of environmental parameters over a period of a few years if relying on the energy capacity of existing miniature batteries. In combination, these features significantly decrease the complexity of the sensor 10 and its electronics to attain reductions in size, cost, and power not attainable with current commercial embodiments of environmental sensors.

With reference again to FIGS. 2A-4B, the combined effect of the beams 44 and 46 and their dissimilar materials is to cause the cantilevered structure 30 to bend when subjected to the environmental parameter as a result of a property of the material of at least one of the beams 44 and 46 changing relative to the corresponding property of the other beam 44 or 46 within the cantilevered structure 30. As noted above, a preferred aspect of the invention is that at least one of the beams 44 and 46 is a sensing beam that is entirely formed of or contains a dissimilar material having one or more properties that reversibly or irreversibly changes as a result of exposure to a parameter of interest in the environment to which the device 26 is subjected. For convenience, the beam 44 represented in the drawings will be referred to as the sensing beam 44 and the beam 46 will be referred to as a second beam 46, though it should be understood that the locations and number of sensing and second beams 44 and 46 may be changed within the cantilevered structure 30.

Various materials are capable of exhibiting reversible or irreversible changes in response to a parameter present in an environment, including metals (including metal alloys), ceramic materials, and organic materials, and therefore such materials may be candidates for use as the dissimilar material of the sensing beam 44. If the dissimilar material is curable, nonlimiting examples of suitable organic materials include thermoplastic and thermoset materials that undergo curing when subjected to an environmental parameter that acts as a curing stimulus to the organic material, nonlimiting examples of which include electromagnetic radiation, chemicals, biological agents, temperature, moisture/humidity, nuclear particle radiation, etc. Particular organic materials believed to be suitable for use include epoxies, silicone compounds, etc.

Suitable materials for the second beam 46 (and, in some cases, additional beams) may depend on the composition of the dissimilar material of the sensing beam 44 and whether the response of the cantilevered structure 30 is intended to be reversible or irreversible. Materials for the second beam 46 may be referred to as inert, meaning that the material undergoes less change relative to the sensing beam 44, and in some cases no change, when subjected to the environmental parameter, i.e., the stimulus that induces a property change in the material of the sensing beam 44. For example, if the parameter is temperature the material for the second beam 46 would be chosen on the basis of having a different (e.g., lower) coefficient of thermal expansion (CTE) than the sensing beam 44, and if the parameter is humidity the material for the second beam 46 would be chosen on the basis of having a different (e.g., lower) coefficient of moisture expansion (CME) than the sensing beam 44. In other cases in which the change is to be irreversible, suitable inert materials for the second beam 46 undergo less and in some cases no curing or absorption relative to the sensing beam 44 when subjected to the environmental parameter. Notable but nonlimiting examples of inert materials include metals (including metal alloys), nonmetals (including silicon, silicon-germanium alloys, electrically non-conductive materials such as silicon dioxide and silicon nitride), and certain polymers.

Though curing is often considered to be irreversible, in situations in which the response (deflection) of the cantilevered structure 30 utilizing a curable sensing beam 44 is desired to be temporary or reversible, the property change in the sensing beam 44 may be reversible, for example, through a thermal or chemical treatment, causing the cantilevered structure 30 to at least partially return to its original orientation relative to its contacts 40 and 42. Alternatively, the second beam 46 (or another layer within the cantilevered structure) of the cantilevered structure 30 could be formed of a material in which a property change can be induced to cause the beam to deflect in a direction normal to the beams 44 and 46, but opposite the direction caused by the property change induced in the sensing beam 44 by the parameter of interest. Alternatively, it is foreseeable that the cantilevered structure 30 could be reset by using one or more sensing beams 44 and one or more second beams 46 that in combination are able to at least partially reverse the deflection of the cantilevered structure 30 by exposing the beams 44 and 46 to one or more different environmental parameters.

As understood by those skilled in the art, the cantilevered structure 30 could include additional layers/films, such as stress compensation layers to improve the distribution of any processing-induced strain within the cantilevered structure 30. It is also within the scope of the invention to fabricate either or both beams 44 and 46 of the cantilevered structure 30 to comprise layers that can be patterned for the purpose of modifying the beams 44 and/or 46, including their responses to the environmental parameter being sensed, such as temperature, humidity, chemicals, electromagnetic and particle radiations, UV light, and/or other environmental conditions.

While the beams 44 and 46 are shown as being positioned side-by-side, parallel to each other, spaced apart from each other so as to define a gap 50 of uniform width there between along their lengths, and lying in a single plane that contains the entire cantilevered structure 30, other configurations are possible if the end result is the ability for the dissimilar materials of the beams 44 and 46 to induce deflection in the cantilevered structure 30. Furthermore, while the side-by-side arrangement of the beams 44 and 46 yields a horizontal cantilevered structure (which as used herein means that the beams 44 and 46 are arranged side by side in a direction parallel to the surface of a substrate above which the cantilevered structure 30 is supported by the anchor 34), it should be understood that the beams 44 and 46 could be arranged one above the other to yield a vertical cantilevered structure (again, relative to the surface of a supporting substrate).

In any case, the cantilevered structure 30 moves in response to the external environmental parameter (stimulus) relative to its contacts 40 and 42, in one operating mode toward one of the contacts 40 or 42 if the cantilevered structure 30 is initially separated from both contacts 40 and 42 (each set initially constituting an open electrical path), or in a second operating mode away from one of the contacts 40 or 42 if the cantilevered structure 30 initially contacts that contact 40 or 42 (which therefore creates an initially closed electrical path). Depending on the operating mode, closure or opening of the contacts 40 or 42 results from the environmental parameter having been at or above a sufficient level for a sufficient amount of time to cause a sufficient change in a property of the sensing beam 44 that leads to bending of the cantilevered structure 30 and contact with the contacts 40 or 42. The direction of deflection is determined by the location of the sensing beam 44 among the beams 44 and 46 within the cantilevered structure 30 and the response of the sensing beam 44 to the environmental parameter resulting from the particular property change in the sensing beam 44.

Figure 2A:
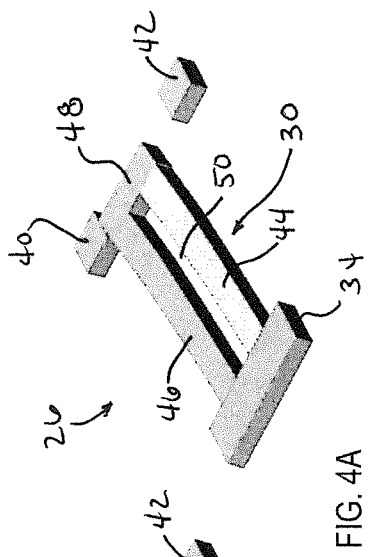
FIGS. 2A and 2B schematically represent perspective and top views, respectively, of a nonlimiting embodiment of an electromechanical sensing device that may be utilized in a sensor of the type represented in FIG. 1.
Figure 3A:
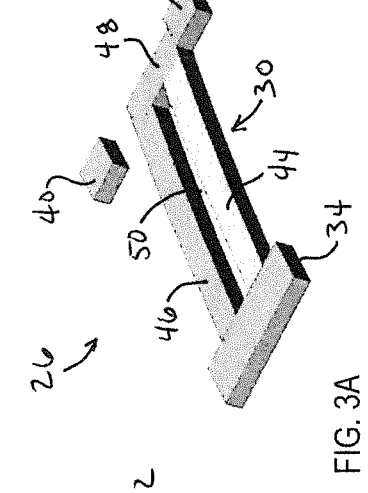
FIGS. 3A and 3B schematically represent perspective and top views, respectively, of the electromechanical sensing device of FIGS. 2A and 2B at one extreme of its operating range in response to a parameter in an environment exceeding a predetermined threshold, and FIGS. 4A and 4B schematically represent perspective and top views, respectively, of the electromechanical sensing device of FIGS. 2A and 2B at an opposite extreme of its operating range.
Figure 4A:
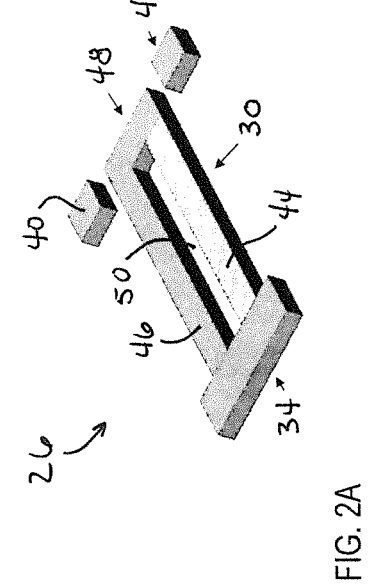
Figure 2B:
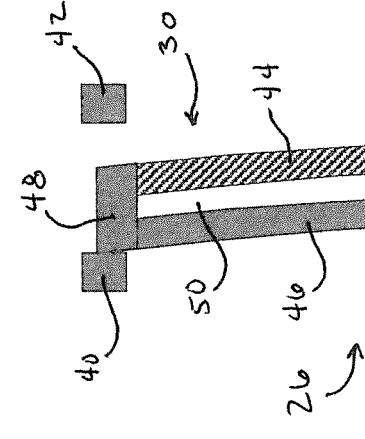
Figure 3B:
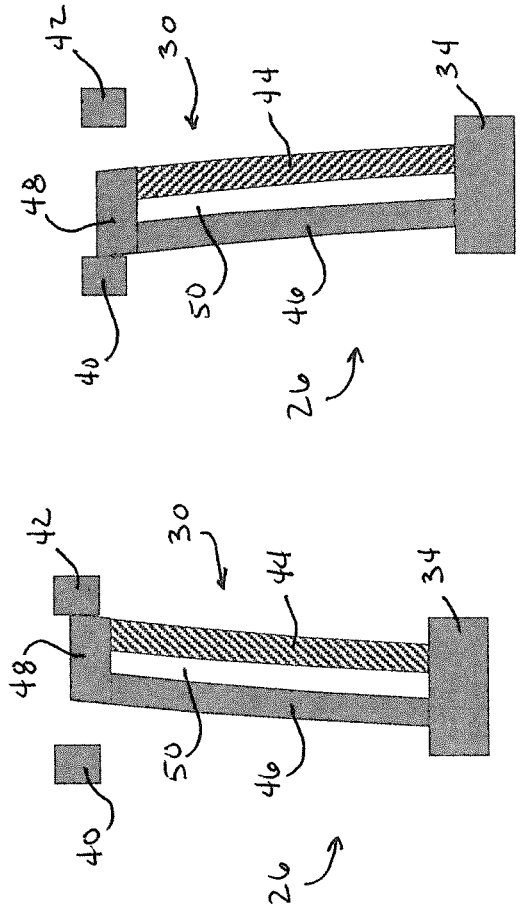
Figure 4B:
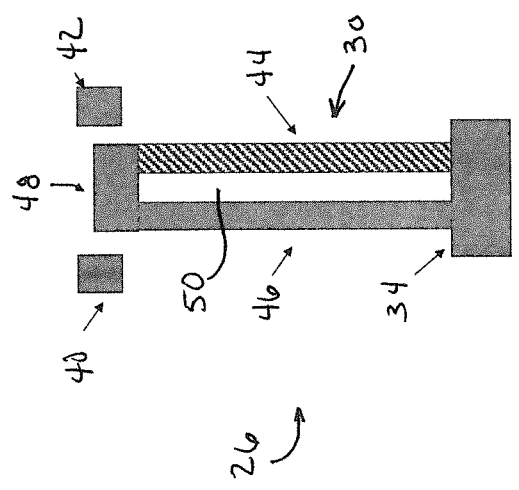

Whereas FIGS. 2A and 2B represent a null position of the sensing device 26 in which the cantilevered structure 30 does not make contact with either contact 40 or 42, FIGS. 3A and 3B represent the sensing device 26 at one extreme of its operating range and FIGS. 4A and 4B represent the sensing device 26 at an opposite extreme of its operating range, indicative of two threshold conditions. The condition of the cantilevered structure 30 as represented in FIGS. 3A and 3B may be the result of only the beam 44 contracting, only the beam 46 expanding, the beam 44 contracting and the beam 46 expanding, both beams 44 and 46 contracting but the beam 44 exhibiting greater contraction, or both beams 44 and 46 expanding but the beam 46 exhibiting greater expansion as a result of the structure 30 being exposed to an environmental parameter of interest. Similar circumstances can be ascribed to the condition of the cantilevered structure 30 as represented in FIGS. 4A and 4B, but with the conditions of the beams 44 and 46 reversed.

In FIGS. 3A and 3B, exposure to the parameter of interest has caused the cantilevered structure 30, initially separated from both contact 40 and 42 as seen in FIGS. 2A and 2B, to contact the contact 42 to form a closed electrical path. Alternatively, FIGS. 3A and 3B could be described as depicting the second operating mode in which the cantilevered structure 30 is initially in contact with the contact 42 to form a closed electrical path, and the effect of the parameter would be to cause the cantilevered structure 30 to deflect to the left, breaking contact with the contact 42 and create an open electrical path as shown in FIGS. 2A and 2B. In FIGS. 4A and 4B, exposure to the same or different parameter of interest has caused the cantilevered structure 30, initially separated from both contact 40 and 42 as seen in FIGS. 2A and 2B, to contact the left contact 40 to form a closed electrical path. Alternatively, FIGS. 4A and 4B could be described as depicting the second operating mode in which the cantilevered structure 30 is initially in contact with the contact 40 to form a closed electrical path, and the effect of the parameter causes the cantilevered structure 30 to deflect to the right, breaking contact with the contact 40 to create an open electrical path as shown in FIGS. 2A and 2B. As such, it should be understood that the null position depicted in FIGS. 2A and 2B may be the result of the presence or absence of a parameter in an environment.

Figures 5A, 5B, 5C:
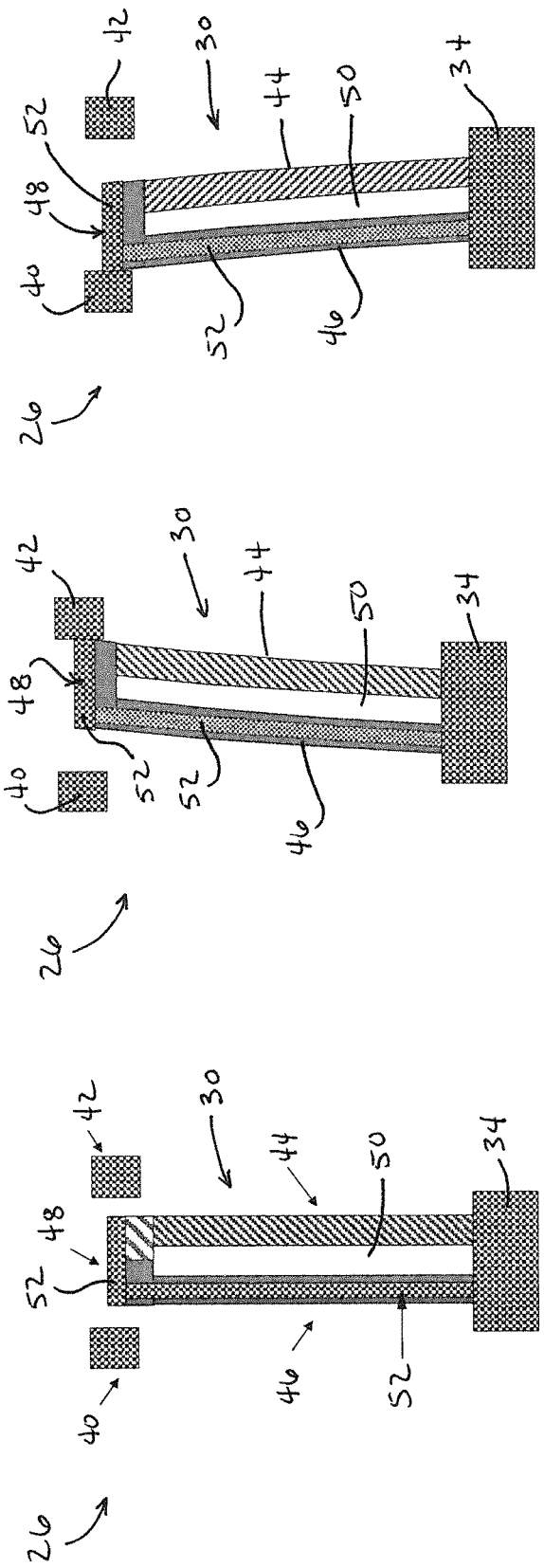
FIGS. 5A, 5B, and 5C schematically represent top views of another nonlimiting embodiment of an electromechanical sensing device that may be utilized in a sensor of the type represented in FIG. 1, and depicts the electromechanical sensing device in a null position (FIG. 5A) and at two opposite extremes (FIGS. 5B and 5C) of its operating range in response to a parameter in an environment.

Either the contacts 40 and 42 or the cantilevered structure 30 may be connected to a power source, for example, the battery 18 of FIG. 1 or a capacitor (which may be an integrated component of the interface electronics 16), such that closure of either contact 40 or 42 serves to transfer a charge or electrical current, generate an electrical voltage, or provide another form of output capable of corresponding to a digital signal. Because the cantilevered end of the cantilevered structure 30 is desired to electrically connect with the contacts 40 and/or 42, at least part of the cantilevered structure 30 is formed of an electrical conductor. As a nonlimiting example, the embodiment of FIGS. 2A-4B depicts the second beam 46 and the connector 48 as making contact with the contacts 40 and 42, and therefore the second beam 46 and connector 48 are both formed entirely or at least partially of an electrically conductive material. Alternatively, the embodiment of FIGS. 5A-5C represents both beams 44 and 46 and the connector 48 as being formed of electrically non-conductive materials, in which case the cantilevered structure 30 includes a separate electrically conductive layer or component 52 for making contact with the contacts 40 and 42.

The sensitivity of the cantilevered structure 30, in other words, the extent to which the cantilevered ends of the cantilevered structure 30 (adjacent the contacts 40 and 42) will deflect when subjected to a given level of the parameter, will depend on the compositions of the beams 44 and 46 (including any additional beams) that make up the cantilevered structure 30 and certain geometric characteristics of the cantilevered structure 30. The sensitivity of the cantilevered structure 30 of any given device 26 can be analytically predicted and controlled based on structure geometries and material properties, including the thickness and the Young's modulus of elasticity of each beam 44 and 46. In this manner, the device 26 can be configured to have a cantilevered structure 30 that performs a switching function at a different level (threshold) of the parameter relative to the cantilevered structure 30 of other device 26 of the sensor 10. Furthermore, an array of sensing devices 26 can contain one or more individual devices 26 whose cantilevered structures 30 are intentionally of different lengths, with longer cantilevered structure 30 being more sensitive to the parameter and resulting in contact with one of the contacts 40 and 42 at progressively smaller parameter changes with increasing beam lengths. Scaling of the feature sizes of the cantilevered structure 30 improves the achievable measurement resolution in addition to the die size reduction. While the movement of the cantilevered end of a cantilevered structure 30 relative to its contacts 40 and 42 will depend in part on the length of the cantilevered structure 30, sensitivity is independent of the beam thickness such that the thicknesses of the cantilevered structures 30 within an array of devices 26 can be minimized to reduce the size of the array to the extent that manufacturing reliability allows. If an array contains a large number of sensing devices 26, the package 14 of the sensor 10 can be fabricated to have a large redundancy of sensing devices 26 that enhances yield without any noticeable cost penalty. For example, significant yield enhancements can be achieved by fabricating the sensing device 26 in large arrays, and then selecting only a subset of devices 26 from each array for actual use by the sensor 10 to perform the sensing function.

As previously noted, the closing or opening of the contacts 40 and 42 of a device 26 by its cantilevered structure 30 may provide a direct indication of a cumulative time-level combination based on the duration that the cantilevered structure 30 was subjected to the environmental parameter at or above a level that initiates a property change (e.g., as a result of curing, absorption, etc.) of an organic material. As such, the sensor 10 is able to process the digital outputs of its devices 26 to not only generate data corresponding to levels of a parameter (for example, temperature), but also data corresponding to the duration of exposure to a parameter. The sensor 10 or the system/network with which it communicates may also be operable to combine or integrate the level and duration data obtained from its different device 26 according to a mathematical model.

As a result of the responses of the cantilevered structure 30 to an environmental parameter resulting in an open or closed electric contact that subsists regardless of subsequent levels of the parameter within the environment, the sensing devices 26 of the sensor 10 are effectively store digital data generated by the devices 26 even if there is no external power supplied to the sensor 10 for extended periods of time. In this manner, the sensor 10 is particularly well suited for long-term tracking and recording of one or more environmental parameters.

Figure 6:
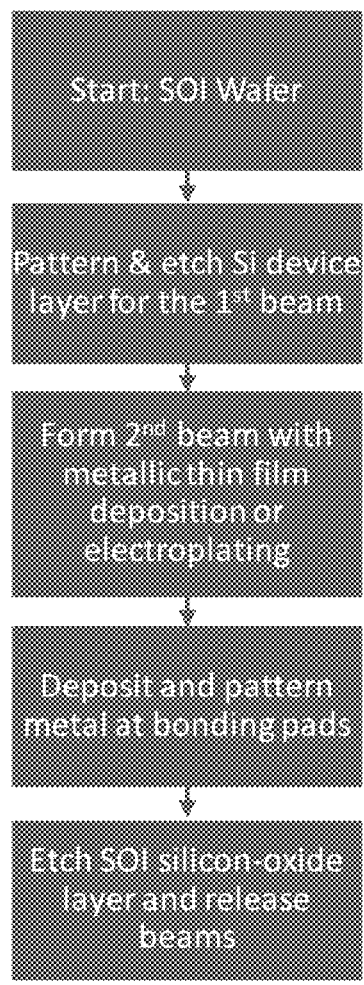
FIGS. 6, 7, and 8 represent nonlimiting examples of process flows for fabricating electromechanical sensing devices of types represented in FIGS. 2A through 5C.
Figure 7:
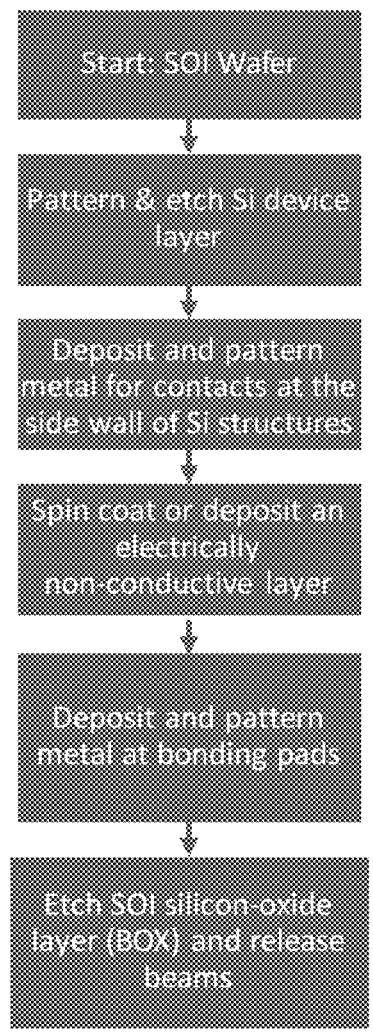
Figure 8:
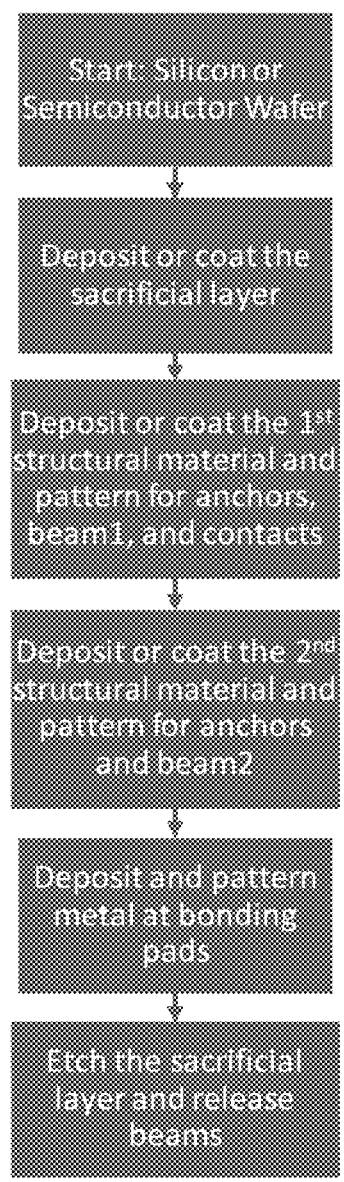

In a particular nonlimiting embodiment, the beams 44 and 46 of the cantilevered structures 30 of an array of sensing devices 26 are constructed of metallic and/or silicon layers. In such an embodiment, the sensing devices 26 can be fabricated using MEMS processes. FIGS. 6, 7 and 8 set forth steps that may be performed in three nonlimiting examples of MEMS processes. FIG. 6 represents an example process flow for fabricating a cantilevered structure 30 when silicon and an electrically-conductive metallic structure are used to form the beams 44 and 46, respectively. FIG. 7 represents an example process flow for fabricating a cantilevered structure 30 when silicon and a non-electrically conductive material are used to form the beams 44 and 46. FIG. 8 represents an example process flow for fabricating a cantilevered structure 30 using a surface micromachined MEMS process. Those skilled in the art will appreciate that other MEMS fabrication processes and variations of these MEMS processes could be used to fabricate sensing devices 26 of types described above.

Figures 9A, 9B, 9C:
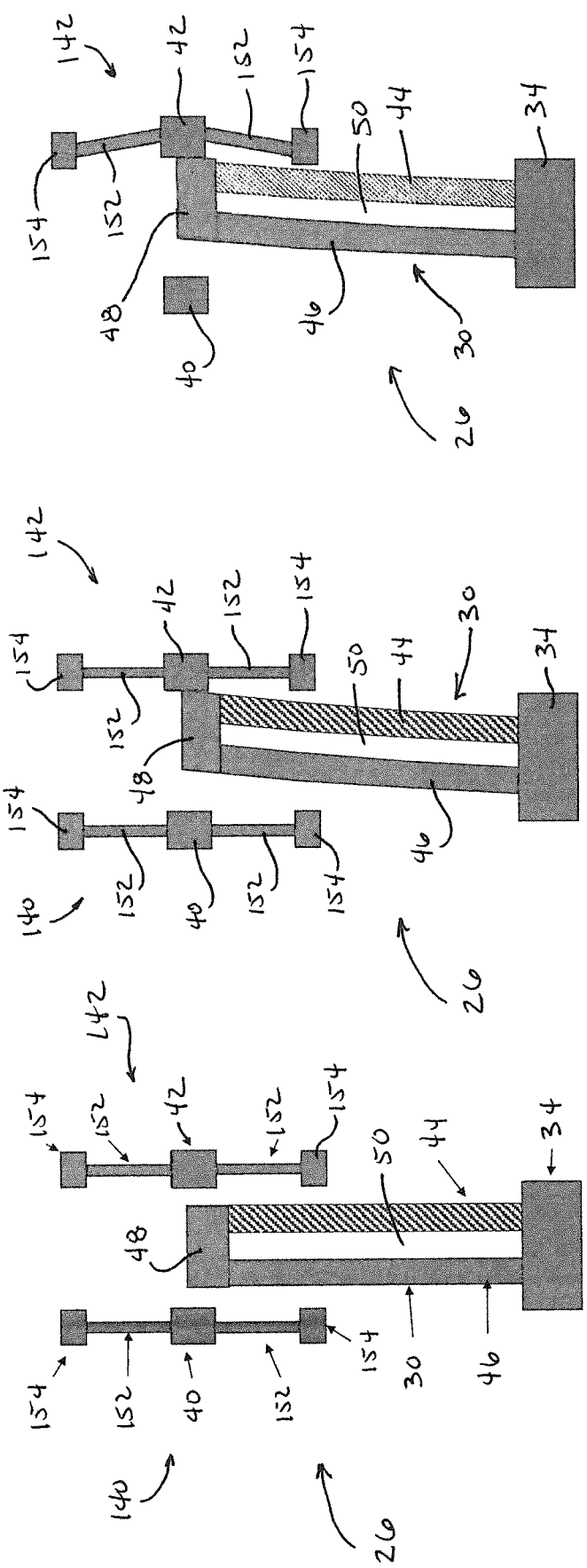
FIGS. 9A, 9B, and 9C schematically represent top views of another nonlimiting embodiment of an electromechanical sensing device that may be utilized in a sensor of the type represented in FIG. 1, and depict the sensing device in a null position (FIG. 9A), a contact position (FIG. 9B), and an extreme position (FIG. 9C) of its operating range in response to different levels of a parameter in an environment.

Under certain circumstances, sensing devices 26 fabricated with cantilevered structures 30 as described above may be exposed to levels of a parameter that far exceed the level required for the structures 30 to contact one of their contacts 40 or 42. The resulting additional force to which a cantilevered structure 30 and its contacts 40 and 42 are subjected may in some cases result in irreversible (plastic) deformation of the cantilevered structure 30 that may negatively affect its mechanical switching properties or reliability over time. To address this possibility, FIGS. 9A, 9B, and 9C schematically represent an embodiment of a sensing device 26 that employs one or more elastic contact structures 140 and 142, in which the contact 40 and 42 are suspended between a pair of flexible support beams 152, each connected to an anchor 154 to enable the contacts 40 and 42 to deflect with their corresponding cantilevered structures 30 in the event of a large contact force imposed by the structures 30. FIG. 9A depicts the cantilevered structure 30 of the sensing device 26 in a null position in which the structure 30 contacts neither contact 40 or 42, and FIG. 9B depicts the cantilevered structure 30 in a contact position in which the structure 30 has made initial contact with the contact 42. FIG. 9C represents the cantilevered structure 30 in an extreme position resulting from being subjected to an excessive level of the parameter being sensed, and evidences that the contact 42 is free to deflect with the cantilevered structure 30 within the plane containing the beams 44 and 46 to avert permanent damage to the structure 30 when subjected to potential extreme conditions over its operating range. This capability relieves the contact force and reduces if not avoids potential irreversible deformation or damage to the cantilevered structure 30 and contacts 40 and 42. Other aspects of the sensing devices 26 represented in FIGS. 9A-9C and not discussed in any detail here can be, in terms of structure, function, materials, etc., essentially as was described for the previously-described embodiments.

While the invention has been described in terms of particular embodiments, it should be apparent that alternatives could be adopted by one skilled in the art. For example, the sensing devices and their components could differ in appearance and construction from the embodiments described herein and shown in the drawings, functions of certain components of the devices could be performed by components of different construction but capable of a similar (though not necessarily equivalent) function, process parameters could be modified, and appropriate materials could be substituted for those noted. As such, it should be understood that the above detailed description is intended to describe the particular embodiments represented in the drawings and certain but not necessarily all features and aspects thereof, and to identify certain but not necessarily all alternatives to the represented embodiments and described features and aspects. As a nonlimiting example, the invention encompasses additional or alternative embodiments in which one or more features or aspects of a particular embodiment could be eliminated or two or more features or aspects of different embodiments could be combined. Accordingly, it should be understood that the invention is not necessarily limited to any embodiment described herein or illustrated in the drawings, and the phraseology and terminology employed above are for the purpose of describing the illustrated embodiments and do not necessarily serve as limitations to the scope of the invention. Therefore, the scope of the invention is to be limited only by the following claims.

The invention claimed is:

1. An electromechanical sensing device comprising a cantilevered structure and at least one contact configured for contact-mode operation with the cantilevered structure, the cantilevered structure being responsive to a parameter within an environment and to deflect toward or away from the contact thereof in response to the parameter in the environment, the cantilevered structure comprising an anchor, first and second beams suspended from the anchor at first ends of the first and second beams, and a connector that interconnects distal ends of the first and second beams, the first and second beams containing dissimilar first and second materials, respectively, the first and second beams being side-by-side, spaced apart so as to define a gap therebetween along the lengths of the first and second beams, and lying in a plane that contains the cantilevered structure, the first material having at least one property that changes due to exposure to the parameter and a change in the property causes the cantilevered structure to deflect in a direction lying in the plane of the first and second beams as a result of the dissimilarity of the first and second materials, the cantilevered structure being configured to cause the connector to contact and close the contact or break contact and open the contact at a predetermined level of the parameter or from cumulative exposure to the parameter over time; and an elastic contact structure comprising the contact, first and second anchors, and first and second flexible support beams that are each connected to the contact, respectively connected to the first and second anchors, and suspend the contact between the first and second flexible support beams to enable the contact to deflect with the cantilevered structure within the plane of the first and second beams.

2. The electromechanical sensing device according to claim 1, wherein the first and second beams are parallel and the gap between the first and second beams is uniform along the lengths thereof.

3. The electromechanical sensing device according to claim 1, wherein the connector and at least the second beam are electrically conductive, and the second beam and the connector create a closed electrical path with the anchor and the contact when the cantilevered structure causes the connector to contact and close the contact.

4. The electromechanical sensing device according to claim 1, wherein the connector is an extension of the second beam, is formed of the second material, and extends transverse to a parallel direction of the first and second beams.

5. The electromechanical sensing device according to claim 1, wherein the elastic contact structure enables the contact to deflect with the cantilevered structure within the plane of the first and second beams in response to a contact force imposed by the cantilevered structure on the contact.

6. The electromechanical sensing device according to claim 1, wherein the first beam is electrically non-conductive.

7. A method of sensing a parameter within an environment using the electromechanical sensing device of claim 1, the method comprising the steps of:

exposing the cantilevered structure to the parameter within the environment to cause the cantilevered structure to deflect in the direction lying in the plane of the first and second beams and cause the connector to contact and close the contact or break contact and open the contact; and producing a digital output when the connector contacts and closes or breaks contact and opens the contact thereof.

8. The electromechanical sensing device according to claim 1, wherein the elastic contact structure is a first elastic contact structure, the sensor comprises a second of the elastic contact structure, the cantilevered structure is between the first elastic contact structure and the second elastic contact structure, the second beam and the connector create a first closed electrical path with the anchor and the contact of the first elastic contact structure when the cantilevered structure is deflected to cause the connector to contact and close the contact of the first elastic contact structure, and the second beam and the connector create a second closed electrical path with the anchor and the contact of the second elastic contact structure when the cantilevered structure is deflected to cause the connector to contact and close the contact of the second elastic contact structure.

9. A sensor comprising:

an electromechanical sensing device comprising a cantilevered structure and at least first and second contacts configured for contact-mode operation with the cantilevered structure, the cantilevered structure being responsive to a parameter within an environment and to deflect toward or away from the first and second contacts thereof in response to the parameter in the environment, the cantilevered structure comprising an anchor, first and second beams suspended from the anchor at first ends of the first and second beams so that the first ends of the first and second beams separately adjoin the anchor, and a connector that is between the first and second contacts and interconnects distal ends of the first and second beams, the first and second beams containing dissimilar first and second materials, respectively, the connector, the anchor, the first and second contacts, and at least the second beam being electrically conductive, the first and second beams being side-by-side, spaced apart so as to define a gap therebetween along the lengths of the first and second beams and at the anchor where the first ends of the first and second beams adjoin the anchor, and lying in a plane that contains the cantilevered structure, the first material having at least one property that changes due to exposure to the parameter and a change in the property causes the cantilevered structure to deflect in a direction lying in the plane of the first and second beams as a result of the dissimilarity of the first and second materials, the cantilevered structure being configured to cause the connector to contact and close either contact of the first and second contacts or break contact and open either contact of the first and second contacts at a predetermined level of the parameter or from cumulative exposure to the parameter over time, the second beam and the connector creating a closed electrical path with the anchor and a single contact of the first and second contacts that is contacted by the connector when the cantilevered structure is deflected to cause the connector to contact and close the single contact; and means for producing a digital output when the cantilevered structure is deflected to cause the connector to contact and close either contact of the first and second contacts so that the anchor, the second beam, the connector, and the single contact contacted by the connector create the closed electrical path through the anchor, the cantilevered structure, and only the single contact.

10. The sensor according to claim 9, wherein the parameter is at least one parameter chosen from the group consisting of temperature, moisture, electromagnetic radiation, a chemical, a biological agent, and nuclear particle radiation.

11. The sensor according to claim 9, wherein the property of the first material causes the first beam to expand and contract relative to the second beam in response to a change in temperature or humidity.

12. The sensor according to claim 9, wherein the first material is a curable organic material and the property of the first material changes as a result of the first material curing to form a polymeric material containing cross linked polymer chains.

13. The sensor according to claim 9, wherein the change in the property of the first material is reversible.

14. The sensor according to claim 9, wherein the change in the property of the first material is irreversible.

15. The sensor according to claim 9, wherein the second material is an electrical conductor that is electrically connected to the contact of the sensing device through the connector when the connector contacts and closes the contact.

16. The sensor according to claim 9, wherein the second material is electrically non-conductive and the second beam comprises an electrical conductor layer that is electrically connected to the contact of the sensing device through the connector when the connector contacts and closes the contact.

17. The sensor according to claim 9, wherein the first and second beams are parallel and the gap between the first and second beams is uniform along the lengths thereof.

18. The sensor according to claim 9, wherein the first beam is electrically non-conductive.

19. The sensor according to claim 9, wherein the connector is an extension of the second beam, is formed of the second material, and extends transverse to a parallel direction of the first and second beams.

20. The sensor according to claim 9, further comprising an elastic contact structure that comprises the contact and enables the contact to deflect with the cantilevered structure within the plane of the first and second beams in response to a contact force imposed by the cantilevered structure on the contact.

21. The sensor according to claim 20, wherein the elastic contact structure comprises first and second anchors and first and second flexible support beams, the first and second flexible support beams each being connected to the contact, respectively connected to the first and second anchors, and suspending the contact between the first and second flexible support beams to enable the contact to deflect with the cantilevered structure within the plane of the first and second beams.

22. The sensor according to claim 21, wherein the elastic contact structure is a first elastic contact structure, the sensor comprises a second of the elastic contact structure, the cantilevered structure is between the first elastic contact structure and the second elastic contact structure, the second beam and the connector create the closed electrical path with the anchor and the contact of the first elastic contact structure when the cantilevered structure is deflected to cause the connector to contact and close the contact of the first elastic contact structure, and the second beam and the connector create a second closed electrical path with the anchor and the contact of the second elastic contact structure when the cantilevered structure is deflected to cause the connector to contact and close the contact of the second elastic contact structure.

23. The sensor according to claim 9, wherein the sensing device is a first sensing device and the sensor comprises a plurality of additional sensing devices, each of the additional sensing devices comprises a cantilevered structure and at least one contact configured for contact-mode operation with the cantilevered structure thereof, the cantilevered structure of each of the additional sensing devices comprises first and second beams of the first and second materials, respectively, so that a change in the property of the first material causes the cantilevered structures of the additional sensing devices to deflect in a direction lying in a plane of the first and second beams as a result of the dissimilarity of the first and second materials, and each of the sensing devices produces a digital output when the connector thereof contacts and closes or breaks contact and opens the contact thereof.

24. The sensor according to claim 23, wherein the electronic circuitry interfaces with the sensing devices to digitally process the digital outputs of the sensing devices and generate the sensor output therefrom over time as a cumulative output indicating the responses of the sensing devices to the parameter in the environment over time.

25. The sensor according to claim 23, wherein the property of the first material changes as a result of the first material absorbing or curing in response to the parameter in the environment, and the electronic circuitry interfaces with the sensing devices to receive the digital outputs of the sensing devices and relay the digital outputs as the sensor output over time as a cumulative output indicating the responses of the sensing devices to the parameter in the environment over time.

26. The sensor according to claim 23, wherein the electronic circuitry communicates with a subset of the sensing devices, the digital outputs of only the subset of sensing devices are processed by the electronic circuitry to generate the sensor output of the sensor, and a remainder of the sensing devices not part of the subset of sensing devices are responsive to levels of the parameter in the environment outside a range defined by the levels of the parameter in the environment to which the subset of sensing devices are responsive.

27. The sensor according to claim 9, wherein the cantilevered structures of the sensing devices are responsive to the changes in the parameter in the environment without any electrical power supplied to the cantilevered structures.

* * * * *